United States Patent [19]

Liberman

[11] Patent Number: 4,975,963
[45] Date of Patent: Dec. 4, 1990

[54] MUTING CIRCUIT

[76] Inventor: Zvie Liberman, c/o Talk-A-Phone Co., 5013 N. Kedzie Ave., Chicago, Ill. 60625

[21] Appl. No.: 776,089

[22] Filed: Sep. 13, 1985

Related U.S. Application Data

[63] Continuation of Ser. No. 518,815, Aug. 1, 1983, abandoned.

[51] Int. Cl.$^5$ .............................................. H04B 15/00
[52] U.S. Cl. ........................................ 381/83; 381/93
[58] Field of Search ................... 381/76, 82, 83, 85, 381/93, 109, 123; 179/2 B, 37, 81 B, 100 L; 455/218, 221–225; 379/167, 388, 389, 390, 420, 421

[56] References Cited

U.S. PATENT DOCUMENTS

| | | | |
|---|---|---|---|
| 1,909,843 | 5/1933 | Squire | 179/2 B |
| 3,544,720 | 12/1970 | Corderman | 381/123 X |
| 3,840,820 | 10/1974 | Kawada | 455/218 |
| 3,849,603 | 11/1974 | Proios | 179/37 |
| 4,006,310 | 2/1977 | Bayer | 179/37 |
| 4,049,911 | 9/1977 | Schlaff et al. | 179/37 |
| 4,115,658 | 9/1978 | Williams | . |
| 4,165,445 | 8/1979 | Brosow | 381/81 |
| 4,213,082 | 7/1980 | Wisner et al. | . |
| 4,286,290 | 8/1981 | Pyles et al. | . |
| 4,346,261 | 8/1982 | Hestad et al. | 179/81 B |

OTHER PUBLICATIONS

RCA Solid State Division, "Linear Integrated Circuits Monolithic Silicon, CA3280G, CA3280AG Types", File No. 1174.

*Primary Examiner*—Forester W. Isen
*Attorney, Agent, or Firm*—Wood, Phillips, Mason, Recktenwald & Van Santen

[57] ABSTRACT

A muting circuit for a transconductance amplifier has a switch connected across the signal load of the amplifier to short circuit the output.

4 Claims, 1 Drawing Sheet

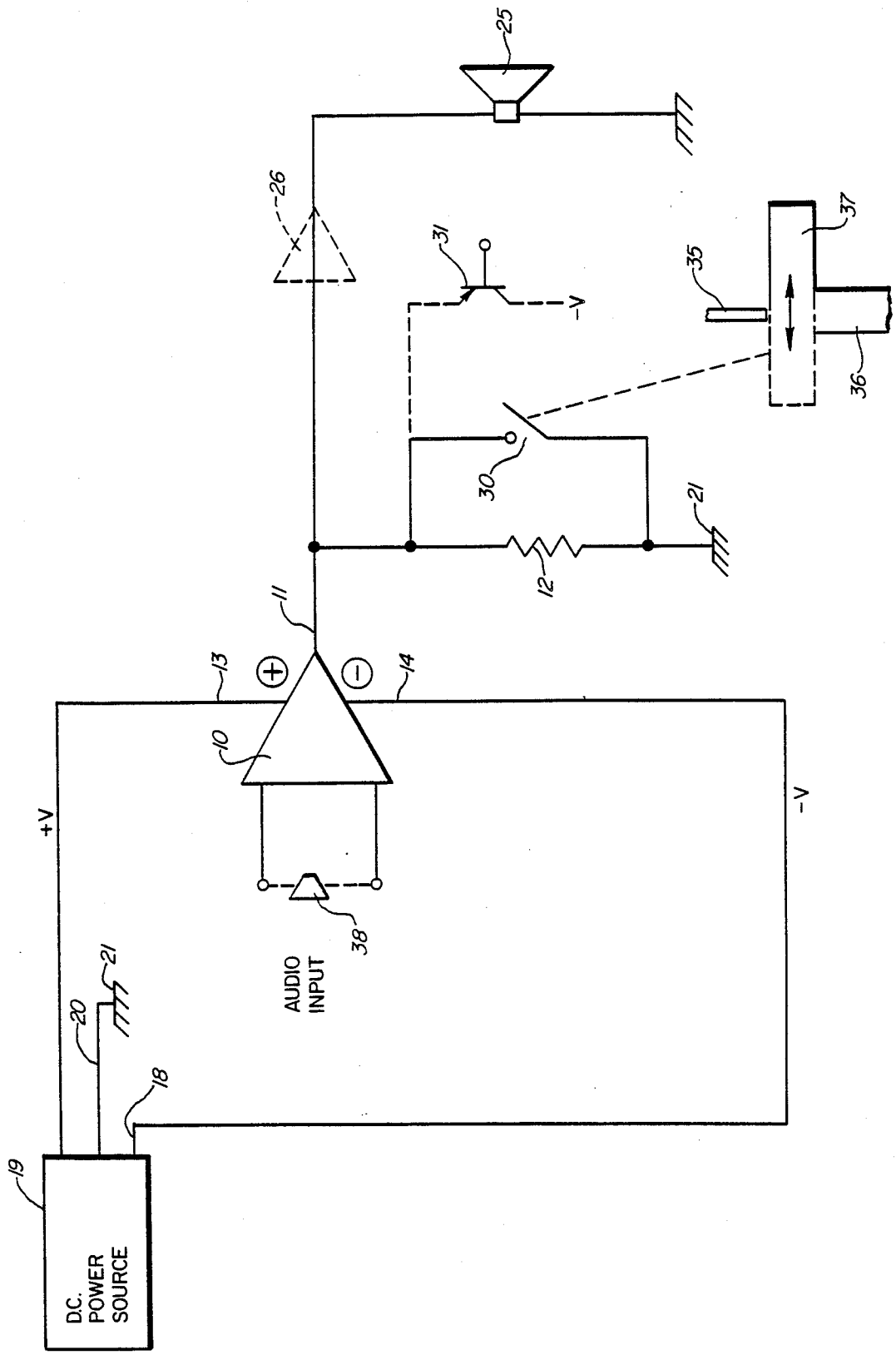

MUTING CIRCUIT

This application is a continuation of application Ser. No. 518,815, filed Aug. 1, 1983, now abandoned.

DESCRIPTION

1. Field of Use

This invention is concerned with a muting circuit particularly for an operational transconductance amplifier in an audio system.

2. Background of the Invention

Muting circuits are commonly used in audio systems, as for audio communications, including public address systems, in radios or the like. Typically, muting is accomplished by diverting or suppressing an amplifier input signal or by turning an amplifier stage off. The circuitry is often complex and operation of the mute can result in a "pop" or other noise when the mute is turned on and off.

SUMMARY OF THE INVENTION

In accordance with the invention a simple muting circuit is provided which avoids the noise described above.

More particularly, an operational transconductance amplifier has a muting circuit which comprises a switch connected across the amplifier load and operative to closed condition to short circuit the load. This suppresses the amplifier output signal without causing an unpleasant noise to occur.

More particularly, the transconductance amplifier is connected with an audio communication system including a microphone connected with the amplifier input and a speaker connected with the amplifier output. The muting switch is responsive to a condition affecting feedback of sound from the speaker to the microphone to mute the output of the amplifier and avoid oscillation.

Further features and advantages of the invention will be apparent from the specification and from the drawing.

BRIEF DESCRIPTION OF THE DRAWING

The FIGURE is a diagrammatic illustration of a muting circuit incorporating the invention.

The muting circuit disclosed herein is for a system utilizing an operational transconductance amplifier 10. The output from such an amplifier is derived from an output terminal 11 across a load, as resistor 12. The amplifier has positive and negative power terminals 13, 14 connected with the positive and negative terminals 17, 18 of a DC power source 19. The power source 19 has a terminal 20 connected with a reference potential 21 which may be electrical ground but is preferably stabilized with respect to the voltage of one of the terminals 17, 18 of the power source as discussed in copending Liberman application SN 518,816 filed Aug. 1, 1983.

A characteristic of an operational transconductance amplifier is that the output terminal 11 can be short circuited indefinitely to either of the power supply terminals or to a power supply reference without damage to the components of the amplifier. An amplifier with such a characteristic is the RCA type 3280.

Amplifier load 12, which may be a resistor, is preferably returned to the reference potential 21. A loudspeaker 25 is connected across amplifier load 12. If additional power is required to drive the loud speaker, a further amplifier 26 may be connected between the output of amplifier 10 and loud speaker 25.

In accordance with the invention, a muting switch 30 is connected across amplifier load 12. When the switch 30 is closed, the output terminal 11 of amplifier 10 is connected directly with power supply reference 21, the output current is short circuited and the output is muted. The muting switch 30 may be a mechanical switch operated either directly in accordance with a muting control, or indirectly as through an electromechanical relay (not shown). Alternatively, in place of mechanical switch 30, the muting switch may be a semiconductor device as transistor 31. The emitter-collector circuit of transistor 31 is shown by broken lines connected across amplifier load 12. With a suitable operating potential applied to the base of transistor 31, transistor conducts, appearing as a short circuit across load 12 and muting amplifier 10.

The FIGURE illustrates the amplifier 10 and muting circuit in an audio communication system where its use is particularly effective. Self-serve gasoline stations and drive-through bank tellers, for example, station attendant inside an enclosure which generally has a glass plate 35 above a wall 36 in which a cash drawer 37 is mounted for the transfer of cash between the attendant and the patron. Communication between the attendant and patron is carried on with an audio system having a microphone 38 located inside the enclosure and a loud speaker 25 located outside the enclosure. When the cash drawer 37 is opened, there is an audio feedback path through the cash drawer from the loud speaker to the microphone. This can result in an undesirable audio oscillation. The muting switch 30 is mechanically linked with drawer 37 to mute the output of amplifier 10 when the drawer is opened. Similarly, an electrical circuit (not shown) might be provided responsive to the position of drawer 37 to operate the semiconductor muting switch 31.

I claim:

1. A muting circuit, comprising:
   an audio frequency operational transconductance amplifier having a signal input terminal, a signal output terminal and power terminals;
   a source of power including a reference potential, the power terminals of the amplifier being connected with said power source;
   a signal source connected with said amplifier input terminal;
   a load connected from said output terminal to said reference potential, the amplifier, signal source and load being in an audio communication system, said audio communication system including a microphone in the signal source and a speaker in the amplifier load; and
   a muting switch connected across said load and operable to closed condition to short the output terminal of the amplifier across said load and mute the output of said amplifier, said switch being responsive to a condition affecting feedback of sound from said speaker to said microphone, to mute the output of said amplifier and avoid oscillation.

2. A muting circuit for an audio communication system installed in a structure, comprising:
   an audio frequency amplifier having a signal input terminal and a signal output terminal;
   a signal source, including a microphone, connected with said amplifier input terminal;

a load, including a speaker, connected with said amplifier output terminal, the signal sources amplifier, and load being in said audio communication system;

a muting switch connected with said system to mute the output of said amplifier; and a movable structural barrier in said structure, between the microphone and speaker, said switch being responsive to the position of the structural barrier to mute the output of the amplifier, avoiding oscillation when the barrier is in a position allowing feedback of sound from the speaker to the microphone.

3. The muting circuit of claim 2 in which the structural barrier is an enclosure and the audio communication system is for communication between an attendant inside the enclosure and a customer outside the enclosure, the microphone being inside the enclosure and the speaker being outside the enclosure, the movable barrier being in a wall of the enclosure.

4. The muting circuit of claim 3 in which the barrier in a cash drawer movable in the wall of the enclosure between a closed position and an open position and the switch is responsive to drawer position to mute the output of the amplifier when the drawer is open.

* * * * *